United States Patent
Boldt et al.

(10) Patent No.: US 7,321,497 B2
(45) Date of Patent: Jan. 22, 2008

(54) ELECTRONIC CIRCUIT APPARATUS AND METHOD FOR STACKING ELECTRONIC CIRCUIT UNITS

(75) Inventors: Sven Boldt, Aschheim (DE); Erwin Thalmann, Villach (AT)

(73) Assignee: Infineon Technologies AG, Munich (DE)

( * ) Notice: Subject to any disclaimer, the term of this patent is extended or adjusted under 35 U.S.C. 154(b) by 217 days.

(21) Appl. No.: 11/137,062

(22) Filed: May 25, 2005

(65) Prior Publication Data

US 2005/0281015 A1  Dec. 22, 2005

(30) Foreign Application Priority Data

Jun. 16, 2004  (DE) .................... 10 2004 028 989

(51) Int. Cl.
    *H05K 1/11*  (2006.01)
(52) U.S. Cl. ...................... 361/803; 361/805
(58) Field of Classification Search ............. 361/749; 257/723, 686; 438/107
    See application file for complete search history.

(56) References Cited

U.S. PATENT DOCUMENTS

| | | | |
|---|---|---|---|
| 5,789,815 A | * | 8/1998 | Tessier et al. ............. 257/723 |
| 5,926,369 A | | 7/1999 | Ingraham et al. |
| 6,208,521 B1 | * | 3/2001 | Nakatsuka ................. 361/749 |
| 7,071,547 B2 | * | 7/2006 | Kang et al. ................. 257/686 |
| 2005/0227412 A1 | * | 10/2005 | Hsuan et al. .............. 438/107 |

OTHER PUBLICATIONS

German Office Action dated Apr. 18, 2005.

* cited by examiner

*Primary Examiner*—Dean A. Reichard
*Assistant Examiner*—Andargie Aychillhum
(74) *Attorney, Agent, or Firm*—Jenkins, Wilson, Taylor & Hunt, P.A.

(57) ABSTRACT

The invention provides an electronic circuit apparatus having a plurality of electronic circuit units (101a-101n), a circuit board (102) and a connection unit (103), the circuit board (102) having a basic board element (200) and a plurality of additional board elements (201-204), the plurality of additional board elements (201-204) being connected to the basic board element (200) by means of connecting elements (301-304) and the circuit units being arranged on the additional board elements (201-204) in such a way that in each case identical signal propagation times are provided between the circuit units arranged on an additional board (201-204) and the connection unit (103).

19 Claims, 2 Drawing Sheets

ELECTRONIC CIRCUIT APPARATUS AND METHOD FOR STACKING ELECTRONIC CIRCUIT UNITS

TECHNICAL FIELD

The present invention relates to integrated circuits, in particular memory chips in which electronic circuit units are stacked.

BACKGROUND ART

Specifically, the present invention relates to an electronic circuit apparatus having a plurality of electronic circuit units, a circuit board, on which the plurality of electronic circuit units are arranged, and a connection unit, which is electrically connected to the plurality of electronic circuit units, for the connection of the electronic circuit units to an external circuit apparatus.

An electronic circuit arrangement, comprising for example integrated circuits such as memory chips, is a complex arrangement made of individual circuit units. Circuit units of this type are memory modules, for example, the number of memory modules required per circuit apparatus continually increasing.

It is important, therefore, to accommodate as many electronic circuit units as possible in an electronic circuit apparatus. Consequently, it is necessary to accommodate additional memory modules in circuit apparatuses with very large storage capacities without increasing a base area of the entire circuit apparatus.

It has thus been proposed to stack chips one above the other, whereby it is possible to achieve a multiple of a storage capacity on a limited space. An essential disadvantage of such stacking of electronic circuit units is that the connections of the individual electronic circuit units always have to be fed to the board (basic board). This gives rise, for the stacked electronic circuit units, to different signal propagation times from the basis board to the connections of the electronic circuit units. Said signal propagation times are not negligible particularly in the case of high-speed circuit apparatuses. Consequently, it is a significant disadvantage that the electronic circuit units cannot be arbitrarily stacked one above the other.

Furthermore, one disadvantage of conventional circuit apparatuses having stacked circuit units is that, when one of the circuit units, in particular a circuit unit arranged in the center of the stack, is defective, it cannot be exchanged or can only be exchanged with very great effort. Consequently, in a disadvantageous manner, the entire circuit apparatus has to be replaced.

SUMMARY OF THE INVENTION

Therefore, it is an object of the present invention to provide a circuit apparatus in which electronic circuit units can be accommodated in a space-saving manner, signal propagation times being equalized and there being the possibility of exchanging defective electronic circuit units in a simple manner.

This object is achieved according to the invention by means of a circuit apparatus having the features of Patent Claim 1.

The object is achieved by means of a method specified in Patent Claim 16.

Further refinements of the invention emerge from the subclaims.

An essential concept of the invention consists in providing a specially designed circuit board comprising a basic board element and a plurality of additional board elements which are connected to one another via flexible connecting elements. In this case, the electronic circuit units are arranged on the additional board elements in such a way that in each case identical signal propagation times are provided between the circuit units arranged on an additional board and the connection unit of the electronic circuit apparatus.

Consequently, it is an essential advantage of the present invention that the electronic circuit apparatus takes a base area that is not substantially greater than that of an electronic circuit unit. Since the additional board elements can be folded onto the basic board element, there is the possibility of exchanging a defective electronic circuit unit in a simple manner. Preferably, electronic circuit units are fitted to an additional board element on both sides, i.e. two circuits units per additional board element, in such a way that the signal propagation times between the circuit units arranged on the additional board and the connection unit of the electronic circuit apparatus are identical or equalized.

Consequently, it is expedient that when the additional board elements are folded onto the basic board element, the space requirement is minimized. In an advantageous manner, a defective electronic circuit unit can be exchanged by unfolding the corresponding additional board element, so that a defective electronic circuit unit can be unsoldered in a simple manner.

Furthermore, it is possible, by virtue of the configuration of the circuit board, to carry out wiring changes in a simple manner. It is possible to achieve flexibility between memory size and a number of data lines DQ.

Furthermore, it is expedient that the invention's stacked arrangement of the electronic circuit apparatus protects the latter from damage. The electronic circuit apparatus according to the invention essentially has:

a) a plurality of electronic circuit units;
b) a circuit board, on which the electronic circuit units are arranged; and
c) a connection unit, which is electrically connected to the plurality of electronic circuit units, for the connection of the electronic circuit unit to an external circuit apparatus, the circuit board having a basic board element; and a plurality of additional board elements, the additional board elements being connected to the basic board element by means of connecting elements, and the circuit units being arranged on the additional board elements in such a way that in each case identical signal propagation times are present between the circuit units arranged on an additional board and the connection unit.

Furthermore, the method according to the invention for stacking a plurality of electronic circuit units in order to obtain a stacked circuit apparatus, essentially has the following steps:

a) providing a circuit board;
b) arranging the electronic circuit units on the circuit board;
c) electrically connecting the electronic circuit units arranged on the circuit board to a connection unit of the stacked circuit apparatus by means of connecting lines;
d) connecting the stacked circuit apparatus to an external circuit device by means of the connection unit;

the circuit board having a basic board element and a plurality of additional board elements, the additional board elements being connected to the basic board element by means of connecting elements, and the circuit units being arranged on the additional board elements in such a way that in each case identical signal propagation times are provided between the circuit units arranged from an additional board and the connection unit.

Advantageous developments and improvements of the respective subject-matter of the invention are found in the subclaims.

In accordance with one preferred development of the present invention, the plurality of electronic circuit units comprises memory units, in such a way that a memory module having a high memory depth preferably formed from said memory units.

In accordance with yet another preferred development of the present invention, the basic board element is configured in such a way that it has a rectangular base area. Furthermore, it is possible to form the basic board element as a regular n-sided polygon. Preferably, the basic board element is an arbitrary n-sided polygon.

In accordance with yet another preferred development of the present invention, the connection unit for the connection of the electronic circuit units to an external circuit device has a plurality of connection elements. In an advantageous manner, the connection elements are formed as contact pads.

In accordance with yet another preferred development, of the present invention, the connection unit with the connection elements is provided at at least one connecting element. A connection of the electronic circuit apparatus in a folded-together state is preferably made possible at the connecting element.

In accordance with yet another preferred development of the present invention, a fixing element is provided at at least one of the additional board elements for the purpose of fixing additional board elements folded over one another.

In accordance with yet another preferred development of the present invention, the connection unit with the plurality of connection elements is arranged at the fixing element.

Preferably, the at least one connecting element and/or the fixing element is embodied from a flexible material. Furthermore, it is advantageous to embody the additional board element and/or the basic board element from a flexible material. The at least one additional board element is folded over the basic board element.

In accordance with yet another preferred development of the present invention, the additional board elements together with the basic board element are folded over one another and formed as a board stack. In this way, it is possible to obtain a stacked electronic circuit apparatus in a simple manner.

In accordance with yet another preferred development of the present invention, cooling devices are arranged between circuit units stacked one above the other. Preferably, one or more of the electronic circuit units are replaced by cooling devices in such a way that the circuit units which are arranged beside the cooling element after the circuit board has been folded together are cooled. Preferably, the cooling devices arranged between the circuit units stacked one above the other are formed as peltier elements.

In accordance with yet another preferred development of the present invention, in each case two circuit units are arranged on both sides on an additional board element.

Exemplary embodiments of the invention are illustrated in the drawings and are explained in more detail in the description below.

DETAILED DESCRIPTION OF THE INVENTION

In the figures, identical reference symbols designate identical or functionally identical components or steps.

Figure 1:
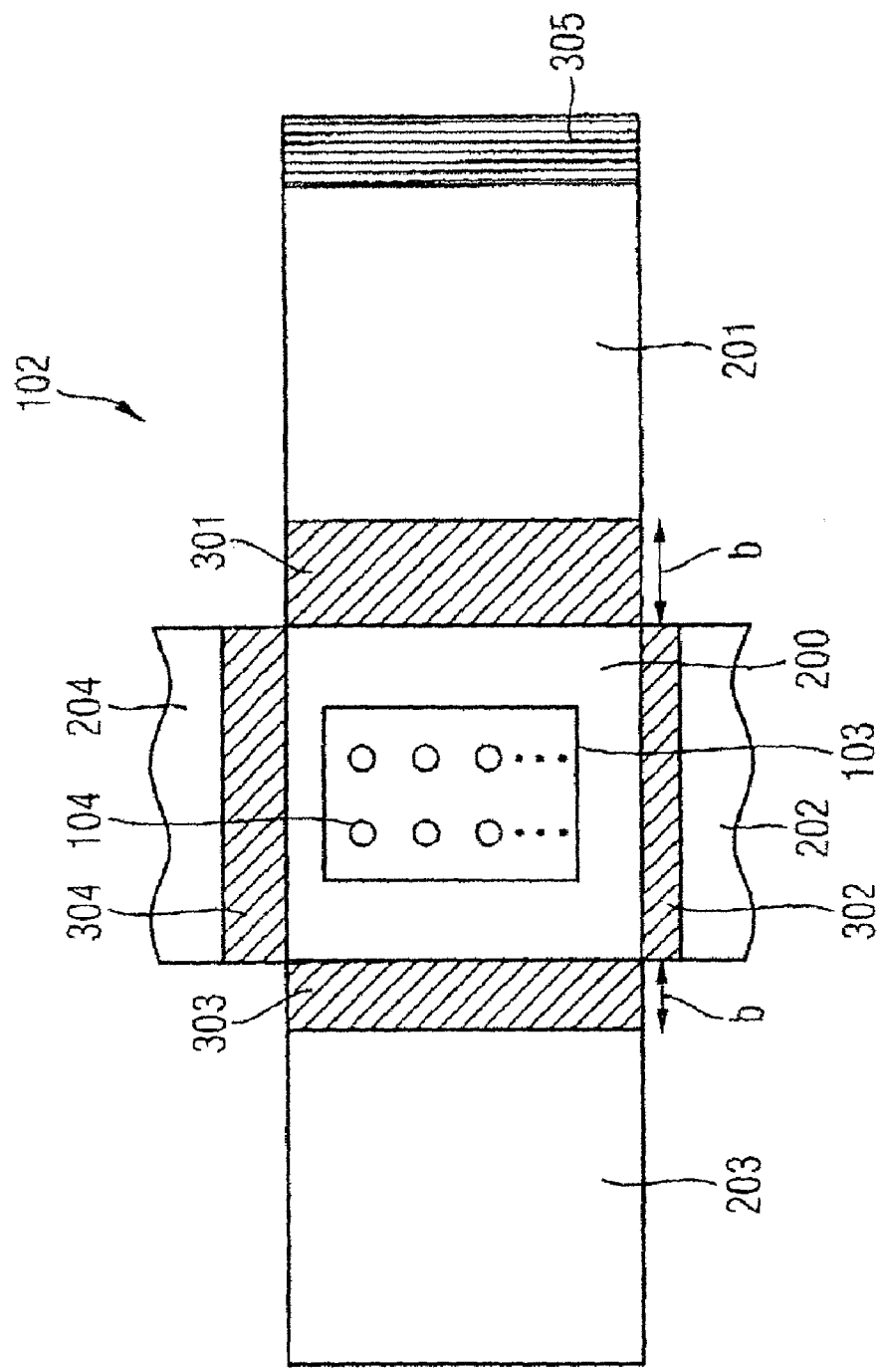
FIG. 1 shows a circuit board according to the invention with a basic board element and four additional board elements which are connected to the basic board element via connecting elements.

FIG. 1 schematically shows a circuit board 102 according to the invention in an unfolded state without electronic circuit units. As shown in FIG. 1, a basic board element 200 has a connection unit 103 arranged thereon. Said connection unit has connection elements 104, some of which are illustrated schematically. The connection elements 104 are preferably formed as contact pads. FIG. 1 shows a preferred exemplary embodiment of the present invention, in which the basic board element 200 has a rectangular cross section. Four additional board elements 201, 202, 203 and 204 have been connected to said basic board element 200.

The fixing of the additional board elements 201-204 to the basic board element 200 is provided by means of flexible connecting elements 301, 302, 303 and 304. The connecting elements are provided from a flexible material, for example as a flexible board. Furthermore, it is possible for the additional board elements 201-204 and/or the basic board element 200 to be produced entirely from a flexible board, for example PCP. One of the additional board elements 201 has a fixing element 305 arranged at the free end, by means of which fixing element the entire stack of electronic circuit units 101a-101n (see FIG. 2) is held in a stable condition after being folded together.

In this way, it is possible to provide memory modules having very large memory depths or storage capacities without a substantial increase in the base area taken up by the memory apparatus.

Figure 2:
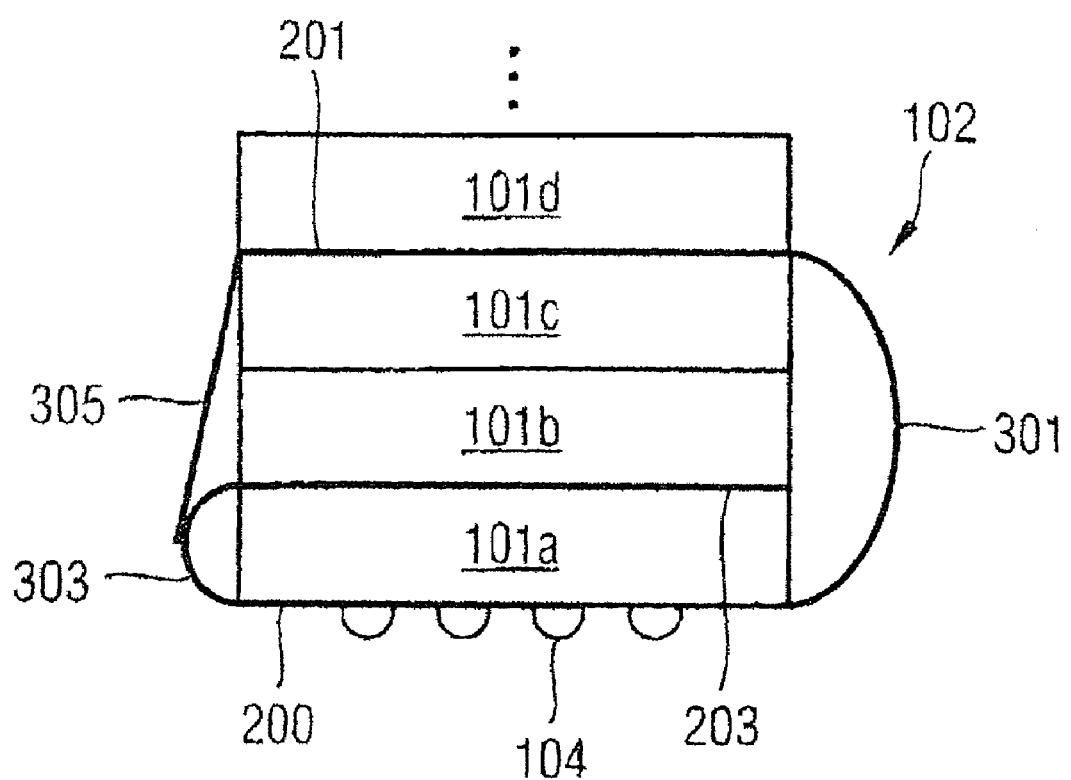
FIG. 2 shows the circuit board shown in FIG. 1 with electronic circuit units arranged thereon in the folded-together state.

FIG. 2 shows the circuit board 102 illustrated in FIG. 1 in a folded-together state in accordance with a preferred exemplary embodiment of the present invention. As shown in FIG. 2, four electronic circuit units 101a-101n are arranged in a manner lying one above the other, in each case two electronic circuit units 101a and 101b, and respectively 101c and 101d, being arranged on opposite sides of an additional board element 203 and 202, respectively. This affords the advantage that the electronic circuit units 101a and 101b are arranged with respect to the connection elements 104 of the connection unit 103 in such a way that the signal propagation times from the electronic circuit unit 101a to the connection unit 103 are identical to the signal propagation times of the electronic circuit unit 101b to the connection unit 103. In the same way, the signal propagation times from the electronic circuit unit 101c and 101d, respectively, to the connection unit 103 are identical. The circuit apparatus according to the invention for stacking electronic circuit units 101a-101n furthermore permits connection elements 104 to be fitted to the connecting elements 301-304 and/or the fixing element 305 (not shown in FIG. 2).

Preferably, in the stacked arrangement according to the invention it is possible for an inner electronic circuit unit, for example the circuit unit 101b, to be replaced by a cooling device, which is preferably formed as a peltier element. The additional board elements 201, 202, 203 and 204 folded over one another are fixed on the basic board element 201 by means of a fixing element 305. As a result, the additional board elements 201-204 together with the basic board element 200 are provided as a board stack. In the exemplary embodiment of the present invention illustrated in FIG. 1 and FIG. 2, the basic board element 200 has a rectangular base area. By means of the connecting elements 301-304, four additional board elements 201-204 can be fitted to said rectangular base area and folded over one another.

It should be pointed out, however, that the basic board element may be formed as an arbitrary n-sided polygon, it being possible for a correspondingly increased number of additional board elements to be folded over one another. The size of the connecting elements 301-304 must in each case correspond to a position at which the corresponding additional board element is positioned in the folded-together stack. Consequently, by way of example, the connecting element 303 shown in FIG. 2 has a smaller width b than the connecting element 301 since the circuit units 101c and 101d fitted to the additional board element 201 are fitted further away from the connection unit 103 than the electronic circuit units 101a and 101b arranged on the additional board element 203.

In the case of the arrangement shown in FIGS. 1 and 2, up to nine different electronic circuit units can be fitted, in each case two electronic circuit units being arranged on an additional board element and an additional electronic circuit unit being arranged on the basic board element. It is furthermore advantageous that different signal propagation times from the connection elements 104 of the connection unit 104 to the individual additional board elements 201-204 can be compensated for by the design of the conductor tracks on the basic board element 200 and/or the additional board elements 201-202.

Since all electric connections are conducted to the connection unit 103 of the basic board element 201, it is possible to provide a meandering design of the conductor tracks in such a way that the electronic circuit units 101a and 101b (FIG. 2) located nearer to the connection unit 103 has longer connecting lines to the connecting element 204 than the electronic circuit units 101c and 101d that are arranged further away from the connection unit 103 and are arranged on the connecting element 201. The fixing element 305 formed as a protruding element of the fixing element 201 makes it possible to stably fix the additional board elements 201-204 folded over one another on the basic board element 200 in such a way that a mechanically extremely stable construction is provided.

In an expedient manner, the board stack can be unfolded if one or more of the electronic circuit units 101a-101n are defective and have to be replaced. Consequently, there is the advantage that when one or more of the electronic circuit units 101a-101n are defective the entire circuit module does not then have to be exchanged. Consequently, the advantage is afforded that the circuit apparatus according to the invention for stacking electronic circuit units 101a-10n provides identical signal propagation times from the connection unit 103 to the respective electronic circuit units 101a-101n and also possibilities for subsequently exchanging electronic circuit units 101a-101n or wiring them anew.

It is possible to achieve flexibility between memory size (memory depth) and the number of data lines DQ. For this purpose, there are two possibilities depending on the additional board elements 201-204 provided:

(i) the number of data lines DQ is maintained and the memory depth/memory size of the circuit apparatus arranged as a stack increases with each additional electronic circuit unit 101a-101n that can be fitted; or (ii) the memory depth/memory size is maintained and the number of data lines is altered.

Four electronic circuit units 101a-101d formed as memory units with a memory depth of 256 MB in each case shall be provided by way of example. These four electronic circuit units 101a-101d can be provided in a flexible manner either as a memory module having the memory depth 1 GB with four data lines or a memory module having a memory depth of 256 MB with 16 data lines.

By virtue of the flexible design of the number of electronic circuit units 101a-101n arranged in the board stack and the flexible number of data lines, it is possible, on the one hand, to increase a memory depth by increasing the number of electronic circuit units, formed as memory units, given a small number of data lines, or to provide a memory width by means of an increased number of data lines given a reduced number of memory units.

Although the present invention has been described above on the basis of the preferred exemplary embodiments, it is not restricted thereto, but rather can be modified in diverse ways.

Moreover, the invention is not restricted to the application possibilities mentioned.

What is claimed is:

1. Electronic circuit apparatus, having:
   a) a plurality of electronic circuit units;
   b) a circuit board, on which the electronic circuit units are arranged, wherein the circuit board has:
      b1) a basic board element; and
      b2) a plurality of additional board elements,
      b3) the additional board elements being connected to the basic board element by means of connecting elements, and
      b4) the circuit units being arranged on the additional board elements in such a way that in each case identical signal propagation times are provided between the circuit units arranged on an additional board and the connection unit; and
   c) a connection unit, which is electrically connected to the plurality of electronic circuit units, for the connection of the electronic circuit units to an external circuit apparatus,
   d) at least one of the electronic circuit units being replaced by a cooling device such that the at least one cooling device is arranged between circuit units stacked on above the other, wherein the at least one cooling device is formed as a Peltier element.

2. Apparatus according to claim 1, wherein the plurality of electronic circuit units comprise memory units, in such a way that a memory module is formed.

3. Apparatus according to claim 1, wherein the basic board element has a rectangular base area.

4. Apparatus according to claim 1, wherein the basic board element is formed as an n-sided polygon.

5. Apparatus according to claim 1, wherein the connection unit for the connection of the electronic circuit units to an external circuit device has a plurality of connection elements.

6. Apparatus according to claim 5, wherein the connection unit with the plurality of connection elements is provided at at least one connecting element.

7. Apparatus according to claim 1, characterized in that a fixing element is provided at at least one of the additional board elements for the purpose of fixing additional board elements folded over one another.

8. Apparatus according to claim 7, wherein the connection unit for the connection of the electronic circuit units to an external circuit device has a plurality of connection elements, and wherein the connection unit with the plurality of connection elements is provided at the fixing element.

9. Apparatus according to claim 1, wherein the at least one connecting element and/or the fixing element is embodied from a flexible material.

10. Apparatus according to claim 1, wherein at least one additional board element and/or the basic board element is embodied from a flexible material.

11. Apparatus according to claim 1, wherein the at least one additional board element is folded over the basic board element.

12. Apparatus according to claim 1, characterized in that the additional board elements together with the basic board element are folded over one another and formed as a board stack.

13. Apparatus according to claim 1, wherein in each case two circuit units are arranged on both sides on an additional board element, the signal propagation times between the circuit units arranged on the additional board elements being equalized by means of meandering connecting lines.

14. Method for stacking a plurality of electronic circuit units in order to obtain a stacked circuit apparatus, having the following steps:
 a) providing a circuit board having a basic board element and a plurality of additional board elements connected to the basic board element by means of connecting elements;
 b) arranging the electronic circuit units on the circuit board;
 c) connecting electrically the electronic circuit units arranged on the circuit board to a connection unit of the stacked circuit apparatus by means of connecting lines;
 d) arranging the circuit units on the additional board elements in such a way that in each case identical signal propagation times are provided between the circuit units arranged on an additional board and the connection unit;
 e) stacking the circuit units one above the other;
 f) arranging at least one cooling device between the circuit units stacked one above the other, the at least one cooling device being formed as a Peltier element; and
 g) connecting the stacked circuit apparatus to an external circuit device by means of the connection unit.

15. Method according to claim 14, wherein the at least one additional board element is folded over the basic board element.

16. Method according to claim 14, wherein additional board elements folded over one another are affixed on the basic board element by means of a fixing element.

17. Method according to claim 14, wherein the additional board elements together with the basic board element are folded over one another and provided as a board stack.

18. Method according to claim 14, wherein in each case two circuit units are fitted on both sides on an additional board element.

19. Method according to claim 14, wherein the signal propagation times between the circuit units arranged on the additional board elements are equalized by means of meandering connecting lines.

* * * * *